United States Patent
Ghyselen et al.

(10) Patent No.: US 7,033,905 B2
(45) Date of Patent: Apr. 25, 2006

(54) RECYCLING OF A WAFER COMPRISING A BUFFER LAYER AFTER HAVING SEPARATED A THIN LAYER THEREFROM BY MECHANICAL MEANS

(75) Inventors: Bruno Ghyselen, Seyssinet-Pariset (FR); Cécile Aulnette, Grenoble (FR); Bénédite Osternaud, Saint Egreve (FR); Yves-Mathieu Vaillant, Crolles (FR); Takeshi Akatsu, Saint Nazaire les Eymes (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/726,039

(22) Filed: Dec. 1, 2003

(65) Prior Publication Data
US 2004/0110378 A1    Jun. 10, 2004

Related U.S. Application Data

(63) Continuation of application No. PCT/FR03/02578, filed on Aug. 26, 2003.

(60) Provisional application No. 60/431,930, filed on Dec. 9, 2002.

(30) Foreign Application Priority Data
Aug. 26, 2002  (FR) ................................. 02 10588

(51) Int. Cl.
    *H01L 21/76* (2006.01)
(52) U.S. Cl. ...................... 438/406; 438/455; 438/458; 438/459
(58) Field of Classification Search ........ 438/455–459, 438/406–409, 507
See application file for complete search history.

(56) References Cited

U.S. PATENT DOCUMENTS

| | | | | |
|---|---|---|---|---|
| 5,854,123 A | * | 12/1998 | Sato et al. | 438/507 |
| 5,882,987 A | | 3/1999 | Srikrishnan | 438/458 |
| 5,966,620 A | * | 10/1999 | Sakaguchi et al. | 438/455 |
| 6,143,628 A | * | 11/2000 | Sato et al. | 438/455 |

(Continued)

FOREIGN PATENT DOCUMENTS

EP        0 849 788 A2    6/1998

(Continued)

OTHER PUBLICATIONS

L. J. Huang et al, "SiGe-on-insulator prepared by wafer bonding and layer transfer for high-performance field-effect transistors", Applied Physics Letters, vol. 78, No. 9, pp. 1267-1269 (2001).

(Continued)

*Primary Examiner*—Dung A. Le
(74) *Attorney, Agent, or Firm*—Winston & Strawn LLP

(57) ABSTRACT

A method of recycling a donor wafer after detaching at least one useful layer is provided, the donor wafer comprising successively a substrate, a buffer structure and, before detachment, a useful layer. The method comprises employing mechanical means to remove part of the donor wafer on the side where the detachment took place, such that, after removal of substance, there remains at least part of the buffer structure capable of being reused as at least part of a buffer structure during a subsequent detachment of a useful layer. The present document also relates to methods of detaching a thin layer from a donor wafer which can be recycled according to the invention, as well as donor wafers which can be recycled in accordance with the invention.

33 Claims, 3 Drawing Sheets

U.S. PATENT DOCUMENTS

| | | | |
|---|---|---|---|
| 6,146,979 A * | 11/2000 | Henley et al. | 438/458 |
| 6,159,824 A * | 12/2000 | Henley et al. | 438/455 |
| 6,284,628 B1 | 9/2001 | Kuwahara et al. | 438/459 |
| 6,306,729 B1 | 10/2001 | Sakaguchi et al. | 438/458 |
| 6,326,279 B1 * | 12/2001 | Kakizaki et al. | 438/406 |
| 6,375,738 B1 | 4/2002 | Sato | 117/89 |
| 6,468,923 B1 | 10/2002 | Yonehara et al. | 438/761 |
| 2001/0003269 A1 | 6/2001 | Wu et al. | 117/94 |
| 2001/0029072 A1 | 10/2001 | Kuwahara et al. | 438/151 |
| 2002/0068419 A1 | 6/2002 | Sakaguchi et al. | 438/458 |
| 2002/0072130 A1 | 6/2002 | Cheng et al. | 438/10 |
| 2003/0124815 A1 | 7/2003 | Henley et al. | 438/460 |
| 2003/0159644 A1 | 8/2003 | Yonehara et al. | 117/8 |
| 2004/0006311 A1 | 1/2004 | Shchervinsky | 604/164.01 |

FOREIGN PATENT DOCUMENTS

| | | |
|---|---|---|
| EP | 0 926 709 A2 | 6/1999 |
| EP | 0955671 | 10/1999 |
| EP | 0 955 671 A1 | 11/1999 |
| EP | 1006 567 A2 | 6/2000 |
| EP | 1 039 513 A2 | 9/2000 |
| WO | WO 99/53539 | 10/1999 |
| WO | WO 01/11930 A2 | 2/2001 |

OTHER PUBLICATIONS

Q. Y. Tong et al "Extracts of Semi-conductor on wafer bonding", Science and Technology, Interscience Technology, Wiley Interscience publication, Johnson Wiley & Sons, Inc.

* cited by examiner

RECYCLING OF A WAFER COMPRISING A BUFFER LAYER AFTER HAVING SEPARATED A THIN LAYER THEREFROM BY MECHANICAL MEANS

CROSS-REFERENCE TO RELATED APPLICATIONS

This application is a continuation of International application PCT/IB2003/004029 filed Aug. 26, 2003, and claims the benefit of U.S. provisional application No. 60/431,930 filed Dec. 9, 2002. The entire content of each application is expressly incorporated herein by reference thereto.

BACKGROUND

1. Field of the Invention

The present invention relates to recycling of a donor wafer having a buffer layer after having transferred a thin semiconductor layer from the donor wafer to a receiving substrate.

2. Background of the Invention

The term "buffer layer" generally refers to a transition layer between a first crystalline structure such as a substrate and a second crystalline structure that has the primary function of modifying properties of the material, such as structural or stoichiometric properties or atomic surface recombination properties.

For a buffer layer, the atomic surface recombination properties may make it possible to obtain a second crystalline structure that has a lattice parameter of that differs substantially from that of the substrate. To this end, the buffer layer may have a composition which varies gradually with thickness, the gradual variation of components of the buffer layer being directly associated with a gradual variation of its lattice parameter.

The buffer layer may also have a more complex form such as a variation in composition with a variable rate, a sign inversion of the rate or discontinuous jumps in composition, possibly completed with a constant composition layer for containing defects.

A metamorphic embodiment of a buffer layer is also possible, such as a metamorphic epitaxy.

A layer or a superposition of layers produced on the buffer layer may be removed from the donor wafer in order to be transferred to a receiving substrate, in order to produce a particular structure.

A major application of transferring thin layers formed on a buffer layer relates to the formation of strained silicon layers. A material is "strained" in tension or in compression if its lattice parameter in the interface plane is greater or less than its nominal lattice parameter, respectively. Alternatively, a layer is made of a "relaxed" material if its lattice parameter in the interface plane is substantially close to its nominal lattice parameter.

When a layer of silicon is strained in tension, some properties, such as the electron mobility of the material, are improved. Other materials such as SiGe may also be subjected to such an operation.

The transfer of layers such as these onto a receiving substrate may be achieved, for example, by the well known SMART-CUT® process. Such processes make it possible to produce various structures, such as SOI (Semiconductor On Insulator) structures.

For example, after detaching a layer of relaxed SiGe from a donor wafer, the structure obtained may then act as a support for growing silicon. Since the nominal lattice parameter of SiGe (which depends on the germanium content) is greater than the nominal lattice parameter of silicon, growth of silicon on the SGOI (Silicon-Germanium On Insulator) pseudo-substrate obtained makes it possible to strain the silicon layer in tension.

An example of using such a process to produce a Si/SGOI structure is described in the IBM document by L. J. Huang et al. entitled "SiGe-On-Insulator prepared by wafer bonding and layer transfer for high-performance field-effect transistors", Applied Physics Letters, 26, Feb. 2001, vol. 78, No. 9, the content of which is incorporated herein by reference. Other applications of metamorphic growth are possible, especially with semiconductors of the III-V family.

Transistors are commonly produced using GaAs-based or InP-based technologies. Generally, electron mobility is higher in InP materials than in GaAs materials. By combining an InP layer and an InGaAs or InAlAs layer, it is possible to improve electron mobility in the material even further.

However, the ability to economically produce and market components using InP technology is limited. Using GaAs technology can be expensive and material availability is sometimes problematic. Also, these materials suffer from mechanical weakness and small sizes. For example, the maximum diameter obtainable for an InP wafer is typically about 4 inches compared with 6 inches for GaAs.

One possible solution to this problem may be found with reference to the receiving substrate. For example, an InP layer may be detached and obtained by metamorphic epitaxy of a buffer layer on a GaAs substrate. However, the metamorphic production technique is complex.

Certain detachment processes, such as a process of the "etch-back" type, generally lead to destruction of the remaining part of the substrate and of the buffer layer during detachment. In some other detachment processes, such as the SMART-CUT® process, the substrate is recycled but the buffer layer is lost. Optimizing and producing such a buffer layer may therefore involve a lengthy, difficult and expensive implementation.

Moreover, internal strains due to the variations in composition may cause the appearance of a high rate of crystalline defects, such as dislocations and point defects. These internal strains, and therefore the generation of defects, may be minimized by increasing the thickness over which the lattice parameter varies. It is mainly for this reason that buffer layers are usually thick, with a typical thickness ranging from one to a few micrometers. The thickness of the buffer layer is further restrained by economic considerations and, at times, certain structural complexities.

Thus there remains a need in the art for a more economical and practical technique for detaching layers of semiconductor material.

SUMMARY OF THE INVENTION

The invention relates to a method of recycling a donor wafer after detachment of a useful layer of a semiconductor material therefrom, wherein the donor wafer, after detachment of the useful layer, includes a substrate, a buffer structure on the substrate and a remaining portion of the useful layer. This method comprises mechanically removing at least part of the remaining portion of the useful layer in order to provide a donor wafer surface that is suitable for use in a subsequent detachment of a useful layer. Advantageously, the mechanically removing comprises polishing, optionally accompanied by chemical etching, and preferably is abrasive polishing or chemical-mechanical planarization. If desired, the method can include conducting a surface smoothing treatment before polishing, after polishing, or both before and after polishing. A useful surface smoothing treatment includes a heat treatment.

In one embodiment, before detachment, the buffer structure includes a buffer layer and an additional layer that has (a) a thickness which is sufficient to contain defects therein or (b) a surface lattice parameter which is substantially different from that of the substrate. Thus, the mechanical removing includes removing all of the remaining portion of the useful layer and part of the additional layer or all of the additional layer and part of the buffer layer. Also, at least one new layer can be provided on the donor wafer after mechanically removing at least part of the remaining portion of the useful layer so as to form a new useful layer or new buffer structure above the existing buffer structure. This new layer can be an overlayer which includes the useful layer to be detached, and in this case the mechanical removing removes any portion of the overlayer that remains after detachment. Preferred overlayers include (a) a material selected from the group consisting of SiGe and strained Si; (b) a material selected from the group consisting of AsGa and Ge; or (c) InP or another alloy of Group III-V elements.

In another embodiment, the method further comprises providing at least two new layers on the donor wafer after mechanically removing at least part of the remaining portion of the useful layer so as to form an interlayer between the buffer structure and the new useful layer, with the interlayer optionally being provided by layer growth. Preferred interlayers include (a) a material selected from the group consisting of SiGe and strained Si; (b) a material selected from the group consisting of AsGa and/or Ge; (c) an alloy of Group III-V elements; or (d) a material selected from the group consisting of InP and a Group III-V material having a lattice parameter substantially identical to that of InP. The buffer structure may have a composition that includes an atomic alloy of binary, ternary, quaternary or of higher degree, selected from the group consisting of Group IV—IV elements; Group III-V elements, and Group II-VI elements.

In other preferred embodiments, (a) the substrate includes Si and the buffer structure includes a SiGe buffer layer having a Ge concentration that increases with thickness and a relaxed SiGe layer on the buffer layer; (b) the substrate includes AsGa and the buffer structure comprises a buffer layer comprising an atomic alloy of Group III-V elements of ternary or higher degree that is selected from possible (Al,Ga,In)—(N,P,As) combinations with at least two additional elements selected from the group consisting of Group III and Group V elements, wherein the two additional elements have a concentration that changes gradually with thickness of the buffer layer; (c) the donor wafer has at least one layer that includes carbon with a carbon concentration in the layer which is less than or equal to about 50%; or (d) the donor wafer has at least one layer that includes carbon with a carbon concentration in the layer which is less than or equal to about 5%.

In yet another embodiment, the method further comprises: providing a zone of weakness beneath the donor wafer surface; bonding the donor wafer surface to a surface of a receiving substrate; and detaching a useful layer from the donor wafer along the zone of weakness. If desired, before the bonding step, a bonding layer can be formed on the donor wafer surface. Also, the zone of weakness can be formed by implantation of atomic species or by porosification. The useful layer that is detached can include all or part of the buffer structure. When part is removed, and the donor wafer includes, before detachment, an overlayer located on the buffer structure, the useful layer that is detached will include at least part of the overlayer.

The invention also relates to a donor wafer produced according to one of the previously described methods. Preferably, all of the useful layer is removed so that only the substrate and the buffer structure is present. Also, the buffer structure can include a buffer layer and an additional layer, with the additional layer having a thickness which is sufficient to contain defects or having a surface lattice parameter which is substantially different from that of the substrate, and a portion of the additional layer remains on the buffer structure. This can be an overlayer so that a portion of the overlayer remains on the buffer structure, or an interlayer between the substrate and the overlayer.

It is to be understood that both the foregoing general description and the following detailed description are exemplary and are intended to provide further explanation of the invention claimed.

BRIEF DESCRIPTION OF THE DRAWINGS

Other aspects, aims and advantages of the present invention will become more clearly apparent on reading the following detailed description of implementing the preferred methods thereof, given by way of non-limiting example and made with reference to the appended drawings in which.

DETAILED DESCRIPTION OF THE PREFERRED EMBODIMENTS

Figure 1:
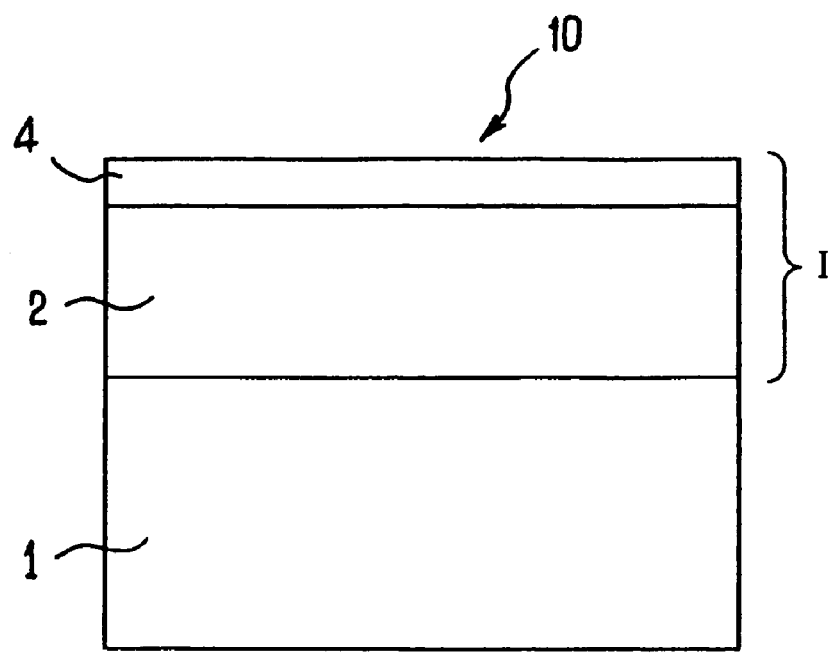
FIG. 1 shows a donor wafer according to the prior art.

The present invention provides a method of recycling a donor wafer after detachment of a useful layer of a semiconductor material therefrom, wherein the donor wafer, after detachment of the useful layer, includes a substrate, a buffer structure on the substrate and a remaining portion of the useful layer. This method comprises mechanically removing at least part of the remaining portion of the useful layer in order to provide a donor wafer surface that is suitable for use in a subsequent detachment of a useful layer. The method includes the mechanical removal of substance relating to part of the donor wafer on the side where the detachment took place, wherein the removal of substance includes employing mechanical means so that, after removal of substance, there remains at least part of the buffer structure capable of being reused as at least part of a buffer structure during a subsequent detachment of a useful layer.

According to another aspect of the invention, a method of detaching a useful layer a donor wafer to be transferred to a receiving substrate is provided such that the donor wafer is recyclable after detachment. The method includes bonding the donor wafer to the receiving substrate on the side of the useful layer to be detached, and detaching the useful layer from the donor wafer wherein the detachment takes place on the side of the donor wafer away from the substrate.

According to a further aspect of the invention, a method of detaching a useful layer a donor wafer is provided wherein the method further includes steps of detaching a useful layer, and steps of recycling the donor wafer, wherein the detachment step alternates with a recycling step.

According to still a further aspect of the invention, a method of cyclically detaching a useful layer a donor wafer is provided wherein the useful layer has at least one of SiGe, strained Si, Ge, or an alloy belonging to the III-V family, the composition of which is respectively chosen from the possible (Al,Ga,In)—(N,P,As) combinations. The method may be used for producing semiconductor structures on an insulator, the structure including a receiving substrate and a useful layer, the useful layer being at least part of the semiconducting thickness of the structure.

The present invention is specifically directed to recycling a wafer comprising a buffer structure, after at least one useful layer has been detached from the wafer so as to integrate this useful layer into a semiconductor structure. The recycling step includes at least partial recovery of the buffer structure so that it can be reused in a subsequent detachment.

The recycling must therefore comprise a suitable treatment which does not damage at least part of the buffer structure, thereby permitting the buffer structure to be reused in a later detachment.

As described herein, the part of the donor wafer being detached will be called the "useful layer".

The term "buffer structure", as used herein, denotes any structure behaving as a buffer layer. Advantageously, the buffer structure has a crystallographic structure which is substantially relaxed and/or without a noteworthy number of structural defects on the surface.

The term "buffer layer", as mentioned above, generally refers to a transition layer between a first crystalline structure such as a substrate and a second crystalline structure that has the primary function of modifying properties of the material, such as structural or stoichiometric properties or atomic surface recombination properties.

Advantageously, the buffer layer has at least one of two functions. The buffer layer may act to decrease the density of defects in the upper layer. The buffer layer may also act to match a lattice parameter of two crystallographic structures with different lattice parameters.

With regard to the second stated function of the buffer layer, the buffer layer is an interlayer between two structures with different lattice parameters. On one of its faces, the buffer layer has a first lattice parameter substantially identical to that of a first structure and a second lattice parameter substantially identical to that of the second structure on its other face.

As embodied herein, the buffer layers or structures described will generally comply with this "matching" buffer layer. However, the present invention is not limited to this type of buffer layer. The invention relates to any buffer layer or any buffer structure as defined in this document in the most general manner.

An example of a method according to the invention will be described below, including recycling a donor wafer of a useful layer by detachment, the donor wafer initially including a support substrate and a buffer structure.

With reference to FIG. 1, a donor wafer 10 (donor of a thin layer by detachment) as is known in the prior art includes a support substrate 1 and a buffer structure I. The application for this donor wafer 10 in the present invention is that of detaching a useful layer, from the part 4 of the buffer structure I and/or at least part of an overlayer formed on the surface of the buffer structure I (not shown in FIG. 1), in order to integrate it into a structure, such as an SOI structure.

The support substrate 1 of the donor wafer 10 includes at least one semiconductor layer having a first lattice parameter at its interface with the buffer structure I. Particularly, the support substrate 1 includes of a single semiconductor having the first lattice parameter.

In a first configuration of the buffer structure I, the buffer structure includes a buffer layer 2. The buffer layer 2, located on the support substrate 1, makes it possible to present at its surface a second lattice parameter substantially different from the first lattice parameter of the substrate 1, and thus to have, in the same donor wafer 10, two layers 1 and 4 respectively having different lattice parameters.

The buffer layer 2 may also make it possible, in some applications, for the overlying layer to prevent layer 4 from containing a high defect density and/or being subject to noticeable stresses.

Furthermore, the buffer layer 2 may make it possible, in some applications, for the overlying layer to have a good surface condition.

In general, the buffer layer 2 has a lattice parameter which changes gradually with thickness in order to establish the transition between the two lattice parameters. Such a layer is generally called a metamorphic layer. This gradual change of the lattice parameter may be produced continuously within the thickness of the buffer layer 2. Alternatively, it may be carried out in "stages", each stage being a thin layer with a substantially constant lattice parameter which is different to that of the underlying stage, so as to discretely change the lattice parameter stage by stage. The buffer layer 2 may have also have a more complex form, such as a variation in composition with a variable rate, a sign inversion of the rate or discontinuous jumps in composition.

The change of the lattice parameter in the buffer layer 2 is advantageously found by increasing therein, starting from the substrate 1, in a gradual manner, the concentration of at least one atomic element which is not contained in the substrate 1. Thus, for example, a buffer layer 2 produced on a substrate 1 made of a unitary material could be made of a binary, tertiary, quaternary or higher material. Moreover, a buffer layer 2 produced on a substrate 1 made of a binary material could be made of a tertiary, quaternary or higher material.

The buffer layer 2 is advantageously produced by growth on the support substrate 1, for example by epitaxy, using known techniques such as the Chemical Vapor Deposition ("CVD") and Molecular Beam Epitaxy ("NBE") techniques.

In general, the buffer layer 2 may be produced by any other known method, in order to obtain, for example, a buffer layer 2 consisting of an alloy of various atomic elements.

A minor step of finishing the surface of the substrate 1 underlying the buffer layer 2, for example by CMP polishing, may possibly precede the production of the buffer layer 2.

In a second configuration of the buffer structure I, and with reference to FIG. 1, the buffer structure I includes a buffer layer 2 (substantially identical to that of the first configuration) and of an additional layer 4.

The additional layer 4 may be between the substrate 1 and the buffer layer 1, or on the buffer layer 1, as shown in FIG. 1.

In a first particular case, this additional layer 4 may constitute a second buffer layer, such as a buffer layer making it possible to contain defects, and thus to improve the crystalline quality of a layer produced on the buffer structure I. This additional layer 4 is made of a semiconductor preferably having a constant material composition. The choice of the composition and of the thickness of such a buffer layer 4 to be produced are then particularly important criteria to achieve this property. Thus, for example, the structural defects in an epitaxially grown layer usually decrease gradually within the thickness of this layer.

In a second particular case, the additional layer 4 is located on the buffer layer 1 and functions as an upper layer to the buffer layer 2. Thus it may fix the second lattice parameter.

In a third particular case, the additional layer 4 is located on the buffer layer 1 and plays a role in the detachment that will be carried out in the donor wafer 10, such as a detachment at its level. The additional layer may also have several functions, such as functions chosen from these last three particular cases.

In an advantageous configuration, the additional layer 4 is located on the buffer layer 2 and has a second lattice parameter different from the first lattice parameter of the support substrate 1. Here, the additional layer 4 is made of a material relaxed by the buffer layer 2, and has the second lattice parameter. The additional layer 4 is advantageously produced by growth on the buffer layer 2, for example, by epitaxial growth by CVD or MBE.

In a first embodiment, the growth of the additional layer 4 is carried out in situ, directly in continuation with the formation of the underlying buffer layer 2, the latter also in this case being advantageously formed by layer growth.

In a second embodiment, the growth of the additional layer 4 is carried out after a minor step of finishing the surface of the underlying buffer layer 2, for example by CMP polishing, heat treatment or other smoothing techniques.

The detachment of a useful layer from the donor wafer 10 is implemented according to one of the following modes. The useful layer to be detached may be part of the additional layer 4. Alternatively, the useful layer to be detached is part of an overlayer (not shown in FIG. 1) which has been formed beforehand on the buffer structure I, for example by epitaxial growth possibly preceded by finishing the surface of the buffer structure I. The donor wafer 10 then functions as a substrate for the growth of the overlayer.

The overlayer may comprise one or more thin layers depending on the detachment mode that it is desired to use. Furthermore, the overlayer has a lattice parameter substantially identical to that of the relaxed material of the free face of the buffer structure I, such as a layer of an identical material, or another material which would have all or some of its crystallographic structure strained in tension or in compression, or the combination of these two types of material.

In a particular embodiment of the donor wafer 10, one or more interlayers are inserted between the buffer structure I and the overlayer. In this case, this or these interlayers are not removed. The useful layer to be detached is part of the additional layer 4 and an overlayer (formed in a substantially identical manner to that described in the second detachment mode).

Figure 2:
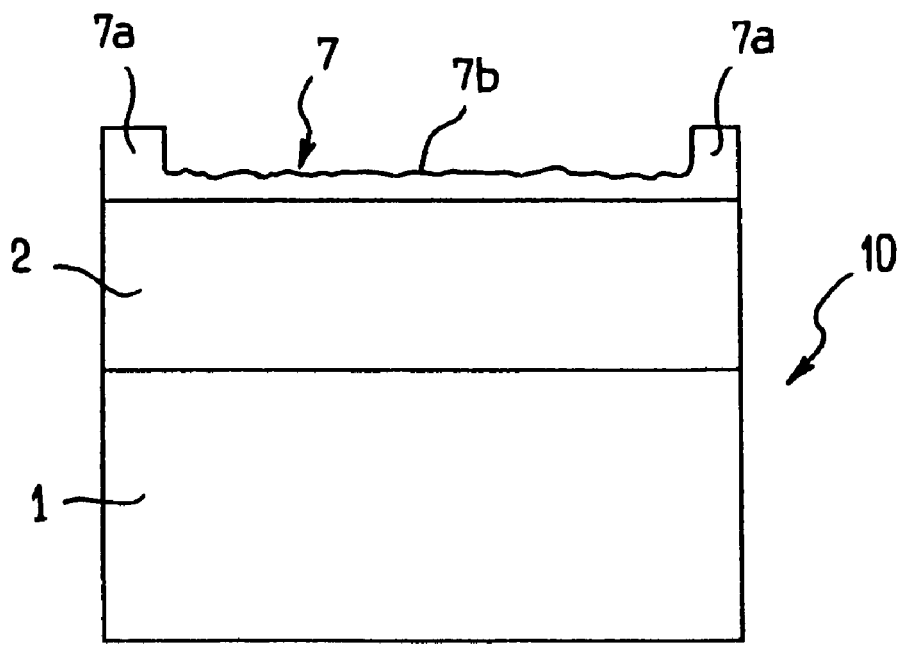
FIG. 2 shows a donor wafer after detachment.

Whatever the detachment mode chosen, and with reference to FIG. 2, after detachment and in the majority of cases, projecting parts 7a and/or rough parts 7b appear on the detachment surface of the remaining donor wafer 10. This detachment surface "in relief" belongs to a post-detachment layer 7 located above the buffer layer 2. This post-detachment layer 7 includes all or some of the layer 4, possibly one or more interlayers and possibly part of an overlayer depending on the detachment mode chosen from the three previously discussed detachment modes. The parts 7a and 7b in relief appearing on the surface of the post-detachment layer 7 mainly depend on the detachment mode and on the technique implemented during detachment.

As a first example, a detachment mode currently used in industry includes detaching the useful layer not over the entire surface of the donor wafer 10, but only over part of the latter (which is generally a substantially centred part) leaving, on the surface of the donor wafer 10, projecting parts, such as those referenced 7a. These projecting parts are generally integral and located at the periphery of the surface of the donor wafer 10, all the projecting parts then being known in the business as a "detachment ring". Other known detachment techniques exist such as the SMART-CUT® technique already mentioned. These other techniques also cause surface roughness such as that referenced 7b on the detachment surface.

In accordance with the invention, once the detachment is carried out, recycling is implemented in order to restore the donor wafer 10.

A first step of recycling according to the present invention includes removing at least the relief parts 7a and 7b (shown in FIG. 2).

This removal of substance according to the invention is implemented such that, after the removal, at least part of the buffer structure I remains, which can be used again during subsequent detachment of a new useful layer.

The remaining part of the buffer structure I, after removal of substance, is thus recycled, unlike the known recycling of the prior art.

The removal of substance includes implementation using means for mechanically abrading substance, such as polishing or grinding.

A polishing technique commonly used includes placing a donor plate 10 between a polishing head and a polishing plate which is able to rotate about a drive shaft. The respective main surfaces of the polishing head and of the polishing plate are substantially parallel. A force applied to the polishing head presses the donor wafer 10 against the upper face of the plate. The rotating movement of the donor wafer 10 with respect to the plate causes friction on one face of the donor wafer 10, and therefore polishes this face.

Preferably, the polishing head, accompanied by the donor wafer 10, moves over the upper surface of the polishing plate along a path determined in order to homogenize the polishing as much as possible. This movement may, for example, be a translational to-and-fro movement along a particular axis or a helical movement. The polishing plate is preferably coated with a textured material or fabric.

A polishing solution making it possible to lubricate the friction action of the plate on the donor wafer may advantageously be injected.

Post-polishing cleaning of the wafer surface, generally with deionized water which is injected, may follow the polishing.

Post-polishing rinsing may be implemented between the polishing and the cleaning, generally with a solution comprising a suitable surfactant which is injected. The prime function of a surfactant is to disperse the residual particles as much as possible in the rinsing solution, which may continue to erode the surface of the slice, and thus to decrease their deposition on the surface, and allow their removal.

One of more of these solutions are advantageously injected so as to moisten the fabric covering the plate which thus distributes the solution as well as possible over the entire surface of the donor wafer 10.

In a first embodiment of the plates, the said plate functions of polishing, rinsing and cleaning are fulfilled only by a single plate.

However, to improve the productivity of the whole method, devices with several plates will be preferred.

In a second embodiment of the plates, the polishing function is fulfilled by a polishing plate and the rinsing and cleaning functions are fulfilled by a single plate called a rinsing/cleaning plate. This embodiment, which uncouples the polishing from the rinsing/cleaning, improves the quality of the rinsing by using, for the rinsing, a plate which is completely free of any particulate residues which may remain attached to a plate.

In a third embodiment of the plates, the polishing plate, the rinsing plate and the cleaning plate are detach plates. This embodiment uncouples, with respect to the second embodiment, the rinsing from the cleaning thus improving the final cleanness of the surface of the slice by using, for the cleaning, a plate which is completely free of any particulate residues which may remain attached to a rinsing plate.

In addition to the polishing, abrasive particles, such as silica particles, may be involved in order to improve the abrasion of the substance.

In addition to the polishing, chemical agents may be involved in order to accompany the mechanical abrasion implemented by the polishing plate with chemical etching.

In an advantageous implementational mode of removing substance from the donor wafer 10, chemical-mechanical planarization, also called CMP, is carried out, the principle of which is to bring together the polishing surface of the polishing plate with a polishing fluid comprising abrasive particles and a chemical etching agent.

In addition to the mechanical polishing, the polishing fluid then jointly uses the chemical etching by using the etching agent and mechanical abrasion by means of abrasive particles, of the surface to be polished of the donor wafer 10.

Here again, the removal of substance may be followed by rinsing and/or cleaning of the polished surface of the donor wafer 10.

It should be noted that the rinsing may in some cases act, not only on faster removal of the residual and abrasive particles of the polishing, but also on the chemical action of the polishing.

This is because, if the chemical etching agent used during polishing has a basic pH, by adding a generally acidic surfactant agent to the polishing solution, fast stopping of the chemical action of the polishing solution is promoted.

For certain semiconductors, such as silicon, the chemical action predominates over the mechanical action (the abrasive particles used while polishing the surface of such semiconductors being small).

Such rinsing with an acidic surfactant therefore makes it possible, especially for silicon, to significantly stop the action of the polishing and to control its effect on the slice. As such, the post-polishing thickness is thus guaranteed and reproducible.

Thus it is possible to control the stopping of polishing, and therefore more accurate control of the thickness removed.

Furthermore, progressive injection of the rinsing solution will be preferred. Injection that is too fast leads to a rapid decrease in the pH of the polishing solution and may, in some cases of semiconductors, such as silicon, have the consequence of increasing the size of the abrasive particles by agglomeration and therefore exposing it to abrasive damage caused by these larger particle agglomerates.

An example of an implementational application of planarizing a layer is presented here in the case where the layer to be planarized includes, at least in part, silicon.

A solution suitable for polishing silicon is generally a basic solution having a pH of between 7 and 10, and preferably between 8 and 10, the chemical agent preferably then having a nitrogen-containing base, such as ammonia. The abrasive particles are preferably silica molecules, with sizes of about a tenth of a micron.

If it is decided to rinse, a surfactant having a pH of preferably between 3 and 5, or even around 4, with a CMC (Critical Micellar Concentration) close to at least 0.1%, will preferably be used. The time of the rinsing step will preferably be about 50% of the polishing time.

These mechanical or chemical-mechanical means are particularly advantageous and within the scope of the invention for controlling the quantity of substance removed so as to allow at least part of the buffer structure I to be preserved.

However, in general, the removal of substance from the donor wafer 10 may comprise implementing all mechanical means of abrading substance, such as, for example, grinding or bombardment with atomic species.

This removal of substance may possibly be preceded by a heat treatment making it possible to further smooth the surfaces to be taken off.

One of the following substance removal modes is therefore used:
(a) removing part of the post-detachment layer 7 comprising at least the relief parts 7a and 7b;
(b) removing the entire post-detachment layer 7; or
(c) removing the entire post-detachment layer 7 and part of the buffer layer 2.

If the post-detachment layer 7 includes part of an original overlayer, the substance removal mode (a) then preferably includes completely taking off this overlayer part.

Figure 3:
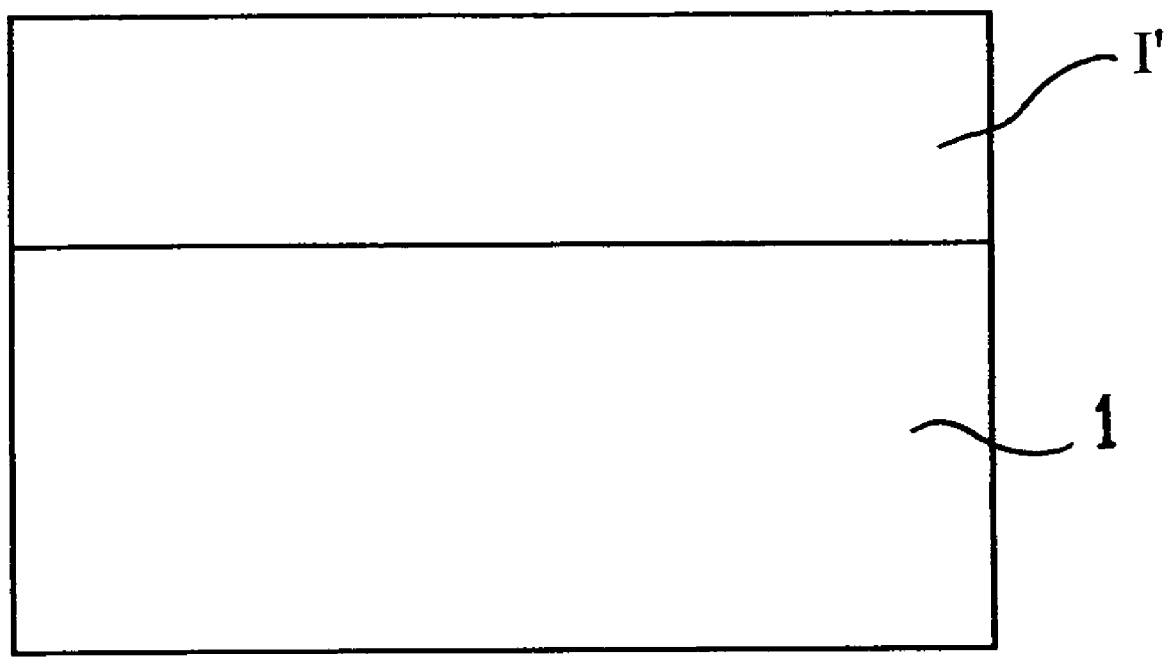
FIG. 3 shows a donor wafer after a first recycling step.

With reference to FIG. 3, the part of the original buffer structure which remains after substance removal is referenced I' and includes:
the entire original buffer structure I when the substance removal mode (a) was used and when the latter did not involve taking off any part of the additional layer 4;
the buffer layer 2 and part of the additional layer 4 when the substance removal mode (a) was used and when the latter involved taking off part of the additional layer 4;
the buffer layer 2 when the substance removal mode (b) was used; or
part of the buffer layer 2 when the substance removal mode (c) was used.

A second recycling step includes, after the first recycling step relating to substance removal, reforming at least some of the layers taken off during the first step.

In certain cases, it will be preferred to finish the surface of the donor wafer 10 where the substance removal implemented during the first recycling step took place, so as to take off any roughness which may have appeared during the substance removal. To achieve this, for example, a heat treatment may be used.

The second step then involves restoring the buffer structure I from the remaining buffer structure I', when part of the original buffer structure I was removed during the first recycling step.

Advantageously, the restoration of the buffer structure I is such that, once formed, the latter is substantially identical to the original buffer structure I.

However, in a particular embodiment, it will be possible to slightly alter some production parameters in order to obtain a buffer structure I which is slightly different from the original. For example, the concentrations of certain compounds in a material will be slightly altered.

Restoring the buffer structure I involves reforming the removed part of the buffer layer 2 when part of the original buffer layer 2 was cut away during the first recycling step.

Restoring the buffer structure I involves reforming all or part of the additional layer 4 when all or part of the original additional layer 4 was cut away during the first recycling step.

In this case, it will be possible to produce an additional layer 4 with a thickness substantially identical to or substantially different from the original.

Once the buffer structure I is restored, an overlayer may be formed above it. The overlayer will preferably at least partly constitute a new useful layer to be detached, possibly with one or more interlayers between the buffer structure I and the overlayer.

The layers possibly formed during this second recycling step are advantageously produced by layer growth on their respective underlying layers, for example by CVD or MBE epitaxial growth.

As a first example, at least one of these layers 1 and 5 is grown in situ, directly in continuation with the formation of the underlying growth support, the latter also being formed in this case advantageously by layer growth.

As a second example, at least one of these layers I and 5 is grown after a minor step of finishing the surface of the underlying growth support, for example by CMP polishing, heat treatment or other smoothing techniques.

Thus, a donor wafer 10 which is substantially identical to the original, that is to say the donor wafer 10 shown in FIG. 1, is finally obtained, with the exception of modifications desired and carried out by a person skilled in the art.

The donor wafer 10 obtained in this way includes at least part of the original buffer structure I, and therefore at least part of the original buffer layer 2, which makes it possible to avoid its complete, lengthy and expensive reformation, as was the case in the known recycling methods.

Figure 4A:
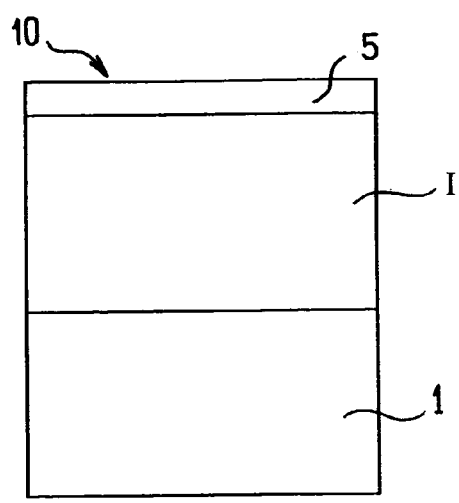
FIG. 4 shows the various steps of a method according to the invention successively comprising detachment of a thin layer from a donor wafer and recycling of the donor wafer after detachment.

With reference to FIGS. 4a to 4f, the various steps are shown of a method of detaching a thin layer from and of recycling a donor wafer 10 after detachment according to the invention, which uses a donor wafer 10 with a layer structure substantially identical to that described above with reference to FIG. 1 and which therefore includes, with reference to FIG. 4a, a substrate 1, and a buffer structure I.

In this exemplary method according to the invention, an overlayer 5 has been added above the buffer structure I.

The removal that will be carried out during this method will relate to detachment of the overlayer 5 and possibly of part of the buffer structure I.

In the same way and in other structural configurations of the donor wafer 10, there may be several overlayers and the detachment would then relate to the overlayers and possibly part of the buffer structure I, or there may be no overlayer and the detachment would then relate to only part of the buffer structure I.

These two layers I and 5 have advantageously been formed by epitaxial growth according to known techniques, for example by CVD and MBE.

As a first example, at least one of these layers is grown in situ, directly in continuation with the formation of the underlying growth support, the latter also being in this case advantageously formed by layer growth.

As a first example, at least one of these layers is grown after a minor step of finishing the surface of the underlying growth support, for example by CMP polishing, heat treatment or other smoothing techniques.

Figure 4B:
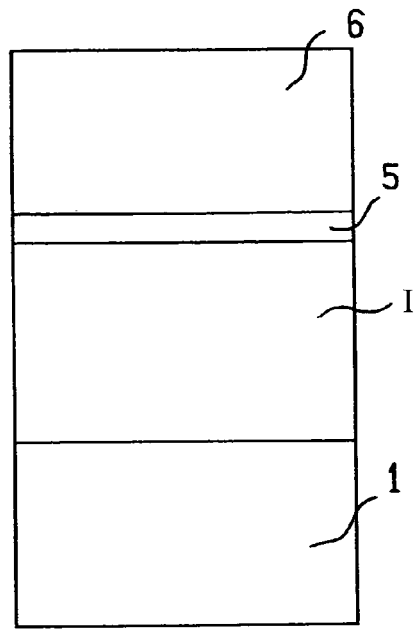
Figure 4C:
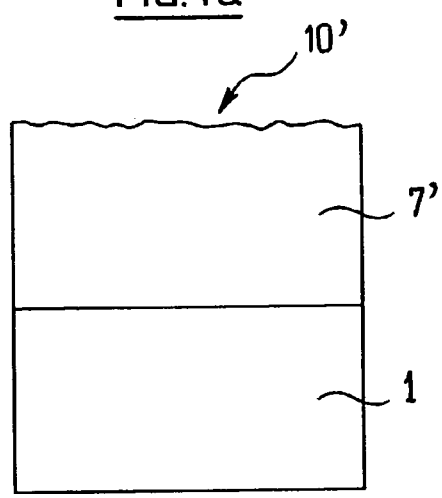

A method of detaching a thin layer is shown in FIGS. 4b and 4c.

A first preferred detachment step of the invention includes creating a zone of weakness in the donor layer 10, in order to carry out a subsequent detachment at this zone, to thus detach the desired useful layer. Several techniques that can be implemented to create a zone of weakness and are presented herein:

A first technique, called SMART-CUT®, known by those skilled in the art (and descriptions of which may be found in a number of works covering techniques for reducing wafers) includes, in its first step, implanting atomic species (such as hydrogen ions) with a particular energy in order to create in this way the zone of weakness.

A second technique includes forming a fragile interface by creating at least one porous layer, as described for example in U.S. Pat. No 6,100,166, the entire content of which is expressly incorporated herein by reference thereto.

The zone of weakness advantageously formed according to one of these two techniques is created above the substrate 1:

in the buffer layer of the buffer structure I;
between the buffer layer and any relaxed layer of the buffer structure I; or
in any relaxed layer of the buffer structure I;
between the buffer structure I and the overlayer 5; or
in the overlayer 5 if the latter is thick enough; this is the particular case of an overlayer 5 including a stack of layers.

With reference to FIG. 4b, a second step relating to detaching a thin layer includes attaching a receiving substrate 6 to the surface of the overlayer 5.

The receiving substrate 6 forms a mechanical support which is rigid enough to support the overlayer 5 which will be detached from the donor wafer 10, and to protect it from any mechanical strains coming from the outside. For example, this receiving substrate 6 may be made of silicon or of quartz or of another type of material.

The receiving substrate 6 is attached by placing it in intimate contact with the overlayer 5 and by bonding it thereon, in which molecular adhesion is advantageously carried out between the substrate 6 and the overlayer 5.

This bonding technique, together with variants, is in particular described in the document entitled "Semiconductor Wafer Bonding" (Science and technology, Interscience Technology) by Q. Y. Tong, U. Gösele and Wiley, incorporated herein by reference in its entirety to the extent necessary to understand this technique.

If necessary, the bonding is accompanied by a suitable pretreatment of the respective surfaces to be bonded and/or by a supply of heat energy and/or a supply of an additional binder. For example, heat treatment applied during or just after the bonding makes it possible to stiffen the bonded connections.

The bonding may also be controlled by a bonding layer, such as silica, inserted between the overlayer 5 and receiving substrate 6, having particularly high molecular bonding abilities.

Advantageously, the material forming the bonding face of the receiving substrate 6 and/or the material of the bonding layer possibly formed, is electrically insulating, in order to produce an SOI structure from the detached layers, the semiconductor layer of the SOI structure then being the useful layer 5 transferred.

Once the receiving substrate 6 is bonded, part of the donor wafer 10 is detached at the zone of weakness.

In the case of the said first technique (SMART-CUT®), in a second step, the implanted zone (forming the zone of weakness) is subjected to a heat and/or mechanical treatment, or other supply of energy, in order to detach it.

In the case of the second technique, the fragile layer is subjected to mechanical treatment or other supply of energy, in order to detach it.

Detachment at the zone of weakness according to one of these two techniques, for example, makes it possible to take off most of the wafer 10, in order to obtain a structure comprising possibly the rest of the buffer structure I, the overlayer 5, any bonding layer and the receiving substrate 6.

A step of finishing the surface of the structure formed, at the detached layer, is then advantageously implemented in order to take off any surface roughness, inhomogeneities in thickness and/or undesirable layers, by using, for example, chemical-mechanical polishing CMP, etching or a heat treatment.

A post-detachment layer 7' forms the part of the donor wafer 10 located above the substrate 1 which remains after detachment, this entire wafer forming a donor wafer 10' to be sent for recycling in order to be reused subsequently during another layer detachment.

Figure 4D:
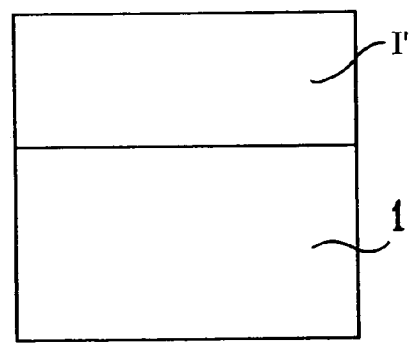
Figure 4E:
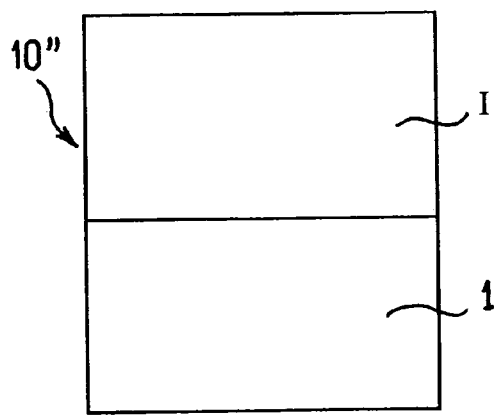
Figure 4F:
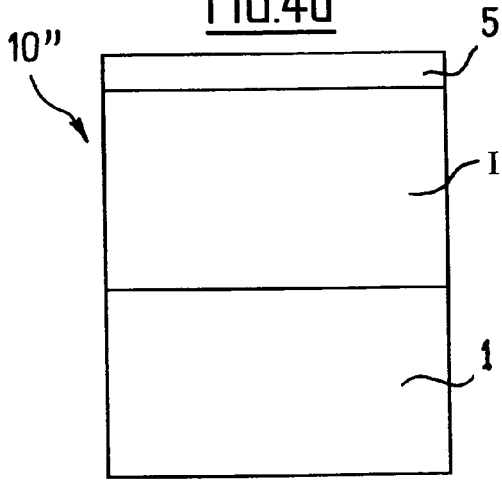

The recycling steps are shown in FIGS. 4d, 4e and 4f.

With reference to FIG. 4d, a first recycling step corresponds to removing part of the post-detachment layer 7'.

Mechanical or chemical-mechanical abrasion or etching according to one of those already discussed above, is implemented to remove part of the post-detachment layer 7'.

Several techniques for removing substance by various mechanical means may also be implemented, especially if the post-detachment layer 7' includes several different original layers (for example, part of the overlayer 5 and part of the buffer structure I), such as, for example, making abrasion by CMP and by simple polishing follow one another.

This mechanical abrasion of substance may be preceded and/or followed by surface treatments, such as chemical etching, heat treatment or smoothing.

Preferably, at the end of this first recycling step, with reference to FIG. 4d, at least part of the buffer structure I' remains.

With reference to FIGS. 4e and 4f, a second recycling step corresponds to the restoration of layers which are substantially identical to those which existed before detachment, with the respective formations of any missing part of the buffer structure I and of an overlayer 5.

The layers are advantageously restored by forming a layer according to a technique which is quite similar to one of the techniques described above.

As a first example, at least one of these layers is grown in situ, directly in continuation with the formation of the underlying growth support, the latter in this case also being advantageously formed by layer growth.

As a second example, at least one of these four layers is grown after a minor step of finishing the surface of the underlying growth support, for example by CMP polishing, heat treatment or other smoothing techniques.

The layers I and 5 obtained of the donor wafer 10" are not necessarily identical to the layers 1 and 5 of the donor wafer 10, it being possible for the donor wafer shown in FIG. 4d to act as a substrate for other types of layers.

After recycling the donor wafer 10 according to the invention, a method of detaching a useful layer can then be implemented again.

Thus, in an advantageous context of the invention, a cyclic method of detaching a useful layer from a donor wafer 10 according to the invention is implemented, by making the following succeed each other repeatedly:
  a detachment mode; and
  the recycling method according to the invention.

Before implementing the cyclic detachment method, it is possible to implement a method of producing the donor wafer 10 according to the invention with one or more of the techniques for producing thin layers on a substrate as described above.

In the remainder of this document, examples are presented of configurations of donor wafers 10 comprising buffer structures I capable of being implemented by a method according to the invention. In particular, materials are presented below which can advantageously be used in such donor wafers.

As discussed above, a buffer structure I produced on a substrate 1 having a first lattice parameter has, most of the time, the prime function of having a second lattice parameter on its free face.

Such a buffer structure I then includes a buffer layer 2 making it possible to produce such matching of a lattice parameter.

The technique most often employed to obtain a buffer layer 2 having this property is to have a buffer layer 2 having of several atomic elements including:
  at least one atomic element which is in the composition of the substrate 1; and
  at least one atomic element, none or very little of which is in the substrate 1, having a concentration changing gradually within the thickness of the buffer layer 2.

The gradual concentration of this element in the buffer layer 2 will be the main cause of the gradual change of the lattice parameter in the buffer layer 2, in a metamorphic manner.

Thus, in this configuration, a buffer layer 2 will mainly be an alloy. The atomic elements chosen for the composition of the substrate 1 and for the buffer layer 2 may be of type IV, such as Si or Ge.

For example, it is possible to have a substrate 1 made of Si and a buffer layer 2 made of SiGe with a Ge concentration changing progressively with thickness between a value close to 0 at the interface with the substrate 1 and a particular value on the other face of the buffer layer 2.

As another example, the compositions of the substrate 1 and of the buffer layer 2 are made from an alloy of the III-V family, such as the possible (Al,Ga,In)—(N,P,As) combinations.

The buffer layer 2 is preferably made from an alloy which is of ternary type or of a higher degree.

For example, it is possible to have a substrate 1 made of AsGa and a buffer layer 2 comprising As and/or Ga with at least one other element, the latter element changing progressively with thickness between a value close to 0 at the interface with the substrate 1 and a particular value on the other face of the buffer layer 2.

The composition of the substrate 1 and of the buffer layer 2 may include pairs of atomic elements of type II-VI, such as the possible (Zn,Cd)—(S,Se,Te) combinations.

EXAMPLES

A number of different of wafer configurations are possible as shown in the following examples.

Example 1

After recycling, the donor wafer 10 includes:
- a substrate 1 made of Si;
- a buffer structure I made of SiGe with a buffer layer 2 and an additional layer 4;
- a post-detachment layer 7 made of Si or of SiGe which forms the rest of an overlayer 5 after detaching part of the latter.

These donor wafers 10 are preferably used when detaching layers of SiGe and/or of strained Si in order to produce SGOI, SOI or Si/SGOI structures.

The buffer layer 2 preferably has a Ge concentration progressively increasing from the interface with the substrate 1, in order to make the SiGe lattice parameter change as explained above.

The thickness of buffer layer 2 is typically between 1 and 3 micrometers in order to obtain good structural relaxation at the surface, and to contain the defects associated with the difference in lattice parameter so that they are buried.

The additional layer 4 is made of SiGe relaxed by the buffer layer 2, with a Ge concentration which is preferably uniform and substantially equal to that of the buffer layer 2 near their interface.

The concentration of germanium in the silicon within the additional SiGe layer 4 is preferably between 15% and 30%.

The additional layer 4 has a thickness which may vary significantly depending on the situation, with a typical thickness between about 0.5 and 1 micron.

Example 2

After recycling, the donor wafer 10 includes:
- a Si substrate 1;
- a buffer structure I with a SiGe buffer layer 2 and an additional layer 4 of substantially relaxed Ge;
- a post-detachment AsGa layer 7 which forms the rest of an overlayer 5 after detaching part of the latter.

The buffer layer 2 preferably has a Ge concentration increasing progressively from the interface with the substrate 1, in order to make the lattice parameter change between that of the Si substrate 1 and that of the additional Ge layer 4.

To this end, in the buffer layer 2, the Ge concentration is made to progress from about 0 to about 100%, or more precisely about 98%, for complete agreement of the theoretical lattice of the two materials.

Example 3

After recycling, the donor wafer 10 includes:
- a substrate 1 including at least one AsGa part at its interface with the buffer structure I;
- a buffer structure I made of a III-V material;
- a post-detachment layer 7 including a III-V material which constitutes the rest of an overlayer 5 after detachment of part of the latter.

The prime benefit of this buffer structure I is to match the lattice parameter of the material V of the overlayer (whose nominal value is about 5.87 angströms) to that of the AsGa (whose nominal value is about 5.65 angströms).

In the bulk III-V materials, and by comparing bulk InP to bulk AsGa, the latter is less expensive, more widely available on the semiconductor market, less fragile mechanically, a material from which the use of technologies with contact by a rear face is better known, and whose size may reach high values (typically 6 inches instead of 4 inches for bulk InP).

In a preferred configuration of the donor wafer 10 before detachment, the overlayer 5 before detachment includes InP to be detached.

Since the bulk InP has a diameter dimension generally limited to 4 inches, the donor wafer 10 gives, for example, a solution to producing an InP layer dimensioned at 6 inches.

A buffer structure I for producing such an overlayer requires a thickness typically greater than one micron, and which will be made to change towards greater thicknesses, especially if it can be recycled according to the present invention.

The epitaxial growth technique usually implemented to produce such a buffer structure I is furthermore particularly difficult and expensive, it is therefore beneficial to be able to recover it at least partially after detaching the useful layer.

Advantageously, the buffer structure I includes a buffer layer 2 including InGaAs with an In concentration changing between 0 and about 53%.

The buffer structure I may further include an additional layer 4 made of a III-V material, such as InGaAs or InAlAs, with a substantially constant concentration of the atomic elements.

In a particular detachment example, the InP overlayer 5 and part of the additional layer 4 will be detached in order to transfer it to a receiving substrate. Thus, it will be possible to profit from any electrical or electronic properties existing between the two detached materials.

This is the case, for example, if the part of the additional layer 4 detached is made of InGaAs or of InAlAs: electronic band discontinuities between the latter material and InP create improved electronic mobilities in the detached layers.

Other configurations of the donor wafers 10 are possible, comprising other III-V compounds, such as InAlAs or the like.

Typical applications of such layer detachment are HEMT or HBT ("High-Electron Mobility Transistor" and "Heterojunction Bipolar Transistor", respectively) production.

In the semiconductor layers presented in this document, other components may be added to them, such as carbon with a carbon concentration substantially less than or equal to 50% or more particularly with a concentration less than or equal to 5% in the layer in question.

Finally, the present invention is not limited to a buffer structure I, an interlayer or an overlayer 5 made of materials presented in the examples above, but extends also to other types of alloys of IV—IV, III-V, II-VI type.

It should be specified that these alloys may be binary, ternary, quaternary or of a higher degree.

The present invention is not limited either to a recyclable buffer layer 2 or buffer structure I having the primary function of matching the lattice parameter between two adjacent structures with different respective lattice parameters, but also relates to any buffer layer 2 or buffer structure I as defined in the most general manner in the present document and which can be recycled according to the invention.

The structures finally obtained after detachment are not limited either to SGOI or SOI structures.

As can be seen, the present invention, as described above and shown in the drawings, provides for a more economical method for recycling a wafer than with prior art techniques.

It will be apparent to those skilled in the art that various modifications and variations can be made in the present invention without departing from the spirit or scope of the invention. Thus, it is intended that the present invention include all such modifications and variations within the scope of the appended claims and their equivalents.

What is claimed is:

1. A method of recycling a donor wafer after detachment of a useful layer of a semiconductor material therefrom, wherein the donor wafer, after detachment of the useful layer, includes a substrate, a buffer structure on the substrate, and a remaining portion of the useful layer, the buffer structure including a buffer layer that has a first side with first crystalline properties, for association with the substrate, and a second side with second crystalline properties that are different from the first crystalline properties, for association with the useful layer, and a portion transitioning between the first and second properties, which method comprises mechanically removing at least part of the remaining portion of the useful layer while preserving the buffer layer in order to provide a donor wafer surface that is suitable for use in a subsequent detachment of a new useful layer.

2. The method of claim 1, wherein the mechanically removing comprises polishing.

3. The method of claim 2, wherein the polishing is abrasive polishing or chemical-mechanical planarization.

4. The method of claim 2, which further comprises conducting a surface smoothing treatment before polishing, after polishing, or both before and after polishing to enable providing the new useful layer thereon.

5. The method of claim 4, wherein the surface smoothing treatment includes a heat treatment.

6. The method of claim 1, wherein, before detachment, the buffer structure includes an additional layer associated with the second side.

7. The method of claim 6, wherein the mechanically removing includes removing all of the remaining portion of the useful layer and part of the additional layer or all of the additional layer and part of the buffer layer.

8. The method of claim 6, wherein the additional layer has a thickness that is sufficient to contain crystalline defects therein to improve the crystalline qualities of the useful layer on the buffer structure.

9. The method of claim 6, wherein at least part of the additional layer is preserved after the mechanical removing.

10. The method of claim 1, which further comprises providing at least one new layer on the donor wafer after mechanically removing at least part of the remaining portion of the useful layer so as to form a new useful layer above the existing buffer structure.

11. The method of claim 10, which further comprises, before detachment, providing the donor wafer with an overlayer which includes the useful layer to be detached, and wherein the mechanically removing removes any portion of the overlayer that remains after detachment.

12. The method of claim 11, wherein the overlayer includes
    (a) a material selected from the group consisting of SiGe and strained Si;
    (b) a material selected from the group consisting of AsGa and Ge; or
    (c) InP or another alloy of Group III-V elements.

13. The method of claim 10, which further comprises providing at least two new layers on the donor wafer after mechanically removing at least part of the remaining portion of the useful layer so as to form an interlayer between the buffer structure and the new useful layer, with the interlayer optionally being provided by layer growth.

14. The method of claim 13, wherein the interlayer includes
    (a) a material selected from the group consisting of SiGe and strained Si;
    (b) a material selected from the group consisting of AsGa and/or Ge;
    (c) an alloy of Group III-V elements; or
    (d) a material selected from the group consisting of InP and a Group III-V material having a lattice parameter substantially identical to that of InP.

15. The method of claim 13, wherein the buffer structure has a composition that includes an atomic alloy of binary, ternary, quatemary or of higher degree, selected from the group consisting of Group IV-IV elements; Group III-V elements, and Group II-VI elements.

16. The method of claim 1, wherein
    (a) the substrate includes Si and the buffer structure includes a SiGe buffer layer having a Ge concentration that increases with thickness and a relaxed SiGe layer on the buffer layer;
    (b) the substrate includes AsGa and the buffer structure comprises a buffer layer comprising an atomic alloy of Group III-V elements of ternary or higher degree that is selected from possible (Al,Ga,In)—(N,P,As) combinations with at least two additional elements selected from the group consisting of Group III and Group V elements, wherein the two additional elements have a concentration that changes gradually with thickness of the buffer layer;
    (c) the donor wafer has at least one layer that includes carbon with a carbon concentration in the layer which is less than or equal to about 50%; or
    (d) the donor wafer has at least one layer that includes carbon with a carbon concentration in the layer which is less than or equal to about 5%.

17. The method of claim 1, which further comprises:
    providing a zone of weakness beneath the donor wafer surface;
    bonding the donor wafer surface to a surface of a receiving substrate; and
    detaching a useful layer from the donor wafer along the zone of weakness.

18. The method of claim 17, wherein the method further comprises, before the bonding step, forming a bonding layer on the donor wafer surface.

19. The method of claim 17, wherein the zone of weakness is formed by implantation of atomic species through the useful layer.

20. The method of claim 1, wherein the useful layer that is detached includes part of the buffer structure.

21. The method of claim 1, wherein the donor wafer includes, before detachment, an overlayer located on the buffer structure, and the useful layer that is detached includes at least part of the overlayer.

22. The method of claim 1, wherein the first crystalline properties comprise a first lattice parameter, and the second crystalline properties comprise a second lattice parameter to enable the useful layer to be associated with the substrate via the buffer layer.

23. The method of claim 22, wherein the substrate has a lattice parameter that is different from the lattice parameter of the useful layer.

24. The method of claim 1, wherein the remaining portion of the useful layer is insufficient to transfer a new useful layer therefrom without adding material thereto.

25. The method of claim 1, wherein the buffer structure is reformed before a new useful layer is added thereon.

26. A method of recycling a donor wafer after detachment of a portion of an overlayer that includes a useful layer of a semiconductor material therefrom, the donor wafer comprising, after detachment of the useful layer:
  a substrate,
  a buffer structure on the substrate, and
  a remaining portion of the overlayer remaining on the buffer structure; and
wherein the method comprises mechanically removing at least part of the remaining portion of the overlayer, including any remaining portion of the useful layer, to provide a donor wafer surface that is suitable for use in a subsequent detachment of a new useful layer.

27. The method of claim 26, wherein the donor wafer further comprises an interlayer between the substrate and the overlayer.

28. The method of claim 27, wherein:
  the overlayer includes:
    (a) a material selected from the group consisting of SiGe and strained Si,
    (b) a material selected from the group consisting of AsGa and Ge, or
    (c) InP or another alloy of Group III-V elements, and
  the interlayer includes:
    (a) a material selected from the group consisting of SiGe and strained Si,
    (b) a material selected from the group consisting of AsGa and/or Ge,
    (c) an alloy of Group III-V elements, or
    (d) a material selected from the group consisting of InP and a Group III-V material having a lattice parameter substantially identical to that of InP.

29. A method of recycling a donor wafer, comprising:
  providing a donor wafer comprising:
    a substrate having a substrate lattice parameter;
    a buffer structure on the substrate, the buffer structure comprising a buffer layer that has a first side with a first lattice parameter to enable association with the substrate lattice parameter, a second side with a second lattice parameter that is different from the first lattice parameter to associate with a useful layer, and a portion transitioning between the first and second lattice parameters; and
    a useful layer of a useful layer material having a useful lattice parameter to enable association with the second lattice parameter, the useful layer being associated with the second side of the buffer layer;
  detaching the useful layer from the donor wafer; and
  mechanically removing at least part of a remaining portion of the useful layer material from the buffer structure, while preserving the buffer layer to preserve the second lattice parameter on the second side.

30. The method of claim 29, wherein the first lattice parameter substantially matches the substrate lattice parameter, and the second lattice parameter substantially matches the useful layer lattice parameter.

31. The method of claim 29, further comprising, after mechanically removing the at least part of the remaining portion, providing a new useful layer on the surface of the donor wafer for subsequent detachment of the new useful layer without reforming the buffer layer.

32. The method of claim 29, wherein the buffer layer has a composition that varies gradually over the thickness thereof for providing a gradual transition of the lattice parameter.

33. The method of claim 29, wherein the at least part of the remaining portion of the useful layer is mechanically removed without damaging the buffer layer.

* * * * *

UNITED STATES PATENT AND TRADEMARK OFFICE
CERTIFICATE OF CORRECTION

PATENT NO. : 7,033,905 B2  Page 1 of 1
APPLICATION NO. : 10/726039
DATED : April 25, 2006
INVENTOR(S) : Ghyselen et al.

It is certified that error appears in the above-identified patent and that said Letters Patent is hereby corrected as shown below:

Title Page,
Item (75) Inventors, after "Yves-Mathieu" change "Vaillant" to -- Le Vaillant --.
Item (63) Related U.S. Application Data, after "Continuation of application no." change "PCT/FR03/02578" to -- PCT/IB03/004029 --.

Column 18,
Line 11 (claim 15, line 3), after "ternary," change "quatemary" to -- quaternary --.

Signed and Sealed this

Eighteenth Day of July, 2006

JON W. DUDAS
*Director of the United States Patent and Trademark Office*